(12) United States Patent
Wang et al.

(10) Patent No.: US 8,309,459 B1
(45) Date of Patent: Nov. 13, 2012

(54) SEMICONDUCTOR PROCESS

(75) Inventors: Wen-Chieh Wang, Taoyuan County (TW); Yi-Nan Chen, Taipei (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 22 days.

(21) Appl. No.: 13/175,882

(22) Filed: Jul. 3, 2011

(51) Int. Cl.
*H01L 21/44* (2006.01)
(52) U.S. Cl. .................................. 438/653; 257/E21.495
(58) Field of Classification Search ......................... None
See application file for complete search history.

*Primary Examiner* — Seahvosh Nikmanesh
(74) *Attorney, Agent, or Firm* — Jianq Chyun IP Office

(57) ABSTRACT

A semiconductor process is provided. A substrate is provided in an etching apparatus, wherein first conductive patterns, a barrier layer and a patterned insulating layer are formed thereon. The first openings are formed between the first conductive patterns, the barrier layer covers surfaces of the first conductive patterns and the first openings, and the patterned insulating layer is formed on the first conductive patterns and has a plurality of second openings. The second openings expose the barrier layer on top corners of the first conductive patterns. Polymer layers are formed on the barrier layer, wherein a thickness of the polymer layer on the top corners of the first conductive pattern is larger than a thickness of the polymer layer on bottom portions of the first openings. An etching process is performed to remove the polymer layer and the barrier layer disposed on the bottom portions of the first openings.

14 Claims, 3 Drawing Sheets

SEMICONDUCTOR PROCESS

BACKGROUND OF THE INVENTION

1. Field of the Invention

The invention relates to a semiconductor process.

2. Description of Related Art

With advancement of technologies, the level of integration of electronic devices is required to be increased, so as to comply with current demands for lightness, thinness, shortness, smallness, and compactness. In order to improve the level of integration, not only dimensions of semiconductor devices can be reduced, but also the distance between semiconductor components can be decreased.

In general, contact plugs are formed between the gates to electrically connect the bit lines, and the contact plugs are electrically insulated from the gates by a barrier layer formed on the surfaces of the gates. For example, the gates and the openings disposed between the gates are formed on the substrate, and then a barrier layer is formed on the substrate to cover the surfaces of the gates and the surfaces of the sidewalls and the bottom portions of the openings entirely. After that, the barrier layer on the bottom portions of the openings is removed to expose the bit line, and then the contact plugs are formed in the openings to electrically connect with the bit lines. Nevertheless, in the above mentioned process, the barrier layer on the top corners of the gates is simultaneously removed by the etching process used to remove the barrier layer on the bottom portions of the openings, causing the barrier layer on the top corners of the gates rounded or even the gates being exposed. As such, the contact plugs subsequently formed in the openings are likely to electrically connect with the top corners of the gates exposed by the barrier layer, and the short may be occurred between the gates and the bit lines.

SUMMARY OF THE INVENTION

The invention is directed to a semiconductor process, so as to prevent the barrier layer on the surface of the conductive pattern from damage.

The invention provides a semiconductor process. A substrate is provided in an etching apparatus, wherein a plurality of first conductive patterns, a barrier layer and a patterned insulating layer are formed on the substrate. A plurality of first openings is formed between the first conductive patterns, the barrier layer covers surfaces of the first conductive patterns and the first openings, and the patterned insulating layer is formed on the first conductive patterns and has a plurality of second openings. The second openings expose the barrier layer disposed on top corners of the first conductive patterns, and each second opening is connected to a corresponding first opening. A first polymer layer and a second polymer layer are formed on the barrier layer, wherein the first polymer layer is disposed on the top corners of the first conductive patterns, the second polymer layer is disposed on bottom portions of the first openings, and a thickness of the first polymer layer is larger than a thickness of the second polymer layer. An etching process is performed to remove the second polymer layer and the barrier layer which are disposed on the bottom portions of the first openings.

According to an embodiment of the invention, the first polymer layer disposed on the top corners of the first conductive patterns is removed simultaneously by the etching process.

According to an embodiment of the invention, after performing the etching process, further includes removing the remained first polymer layer disposed on the top corners of the first conductive patterns.

According to an embodiment of the invention, after performing the etching process, the barrier layer disposed on the top corners of the first conductive patterns is not substantially etched by the etching process.

According to an embodiment of the invention, the thickness of the first polymer layer disposed on the top corners of the first conductive patterns is about 1 nm to 5 nm.

According to an embodiment of the invention, a thickness of the barrier layer disposed on the top corners of the first conductive patterns is about 5 nm to 15 nm.

According to an embodiment of the invention, a plurality of second conductive patterns is formed in the substrate, and each first opening exposes a corresponding second conductive pattern after performing the etching process.

According to an embodiment of the invention, after performing the etching process, further includes forming a contact plug in each first opening, wherein the contact plug is electrically insulated from the first conductive pattern by the barrier layer, and the contact plug is electrically connected to a corresponding second conductive pattern.

According to an embodiment of the invention, a pressure of the etching apparatus is set from 50 mTorr to 150 mTorr when the first polymer layer and the second polymer layer are deposited.

According to an embodiment of the invention, a method of depositing the first polymer layer and the second polymer layer includes using an etching gas including silicon fluoride and silicon chloride.

According to an embodiment of the invention, a material of the first polymer layer and the second polymer layer includes hydrocarbons.

According to an embodiment of the invention, a material of the barrier layer includes low pressure TEOS.

According to an embodiment of the invention, the etching process includes a plasma etching process.

According to an embodiment of the invention, the etching process is performed by using a fluorine-containing plasma.

Based on the above, the polymer layers are formed in the etching apparatus, thereby a thickness of the polymer layer disposed on the top corners of the conductive patterns larger than a thickness of the polymer layer disposed on bottom portions of the first openings. Thus, when the barrier layer on the bottom portions of the openings is removed, the barrier layer on the top corners of the conductive patterns is protected by the polymer layer formed thereon. As such, the barrier layer on the top corners of the conductive patterns is not damaged, thereby providing superior insulating effect to the conductive patterns.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
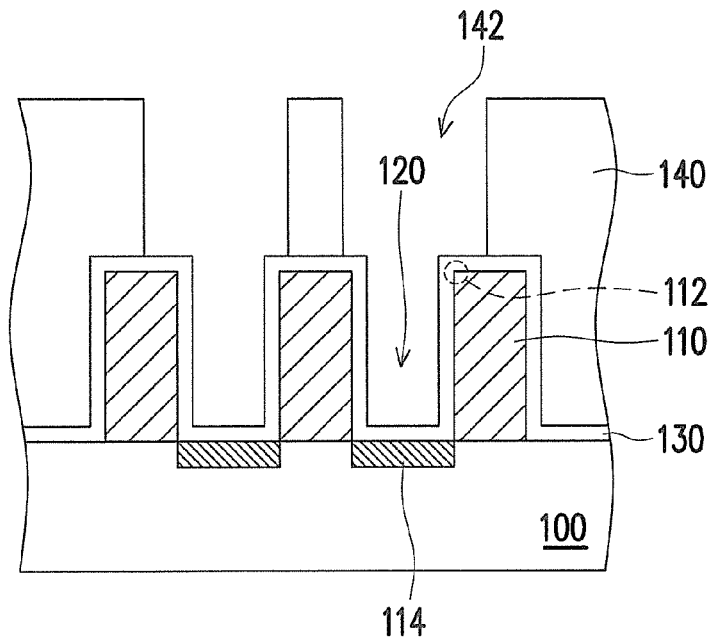
FIG. 1A to FIG. 1E are schematic cross-sectional views illustrating a semiconductor process according to an embodiment of the invention.

FIG. 1A to FIG. 1E are schematic cross-sectional views illustrating a semiconductor process according to an embodiment of the invention. With reference to FIG. 1A, a substrate 100 is provided in an etching apparatus, wherein a plurality of first conductive patterns 110, a barrier layer 130 and a patterned insulating layer 140 are formed on the substrate 100. A plurality of first openings 120 is formed between the first conductive patterns 110, the barrier layer 130 covers surfaces of the first conductive patterns 110 and the first openings 120. The patterned insulating layer 140 is formed on the first conductive patterns 110 and has a plurality of second openings 142. The second openings 142 expose the barrier layer 130 disposed on top corners 112 of the first conductive patterns 110, and each second opening 142 is connected to a corresponding first opening 110. In this embodiment, a plurality of second conductive patterns 114 is formed in the substrate 110, and each first opening 120 exposes a corresponding second conductive pattern 114, for example. The first conductive patterns 110 can be gates, and the second conductive pattern 114 can be bit lines. A material of the barrier layer 130 is low pressure TEOS, for example. A material of the patterned insulating layer 140 is borophosphosilicate glass (BPSG), for example.

Figure 1B:
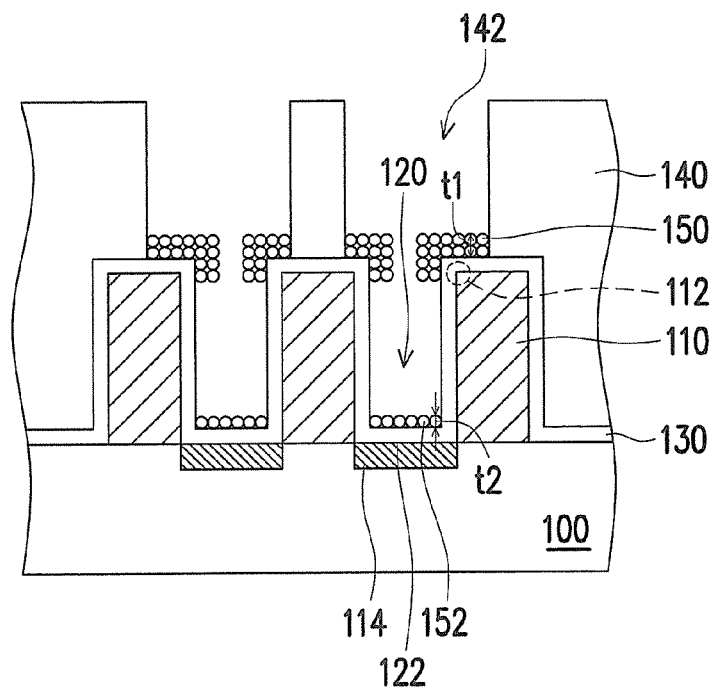

With reference to FIG. 1B, then, a first polymer layer 150 and a second polymer layer 152 are formed on the barrier layer 130, wherein the first polymer layer 150 is disposed on the top corners 112 of the first conductive patterns 110, the second polymer layer 152 is disposed on bottom portions 122 of the first openings 120, and a thickness t1 of the first polymer layer 150 is larger than a thickness t2 of the second polymer layer 150. It is noted that the step of forming the first and second polymer layers 150, 152 is performed in the etching apparatus. In general, when depositing a layer on a structure by a deposition process in the etching apparatus, the deposited layer has a poor step coverage, and therefore the layer deposited on the structure usually has a non-uniform thickness. In this embodiment, by depositing the first and second polymer layers 150, 152 in the etching apparatus, the thickness t1 of the first polymer layer 150 deposited on the top corners 112 of the conductive patterns 110 is consequentially larger than the thickness t2 of the second polymer layer 152 deposited on the bottom portions 122 of the first openings 120. In other words, the invention utilizes the poor step coverage caused by performing the in-situ deposition process in the etching apparatus, and therefore the first and second polymer layers 150, 152 with different thickness t1, t2 on the top corners 112 of the conductive patterns 110 and the bottom portions 122 of the first openings 120 are easily obtained. In this embodiment, a method of depositing the first and second polymer layers 150, 152 can be a plasma deposition process, such as by using a deposition gas including silicon fluoride ($SiF_x$), silicon chloride ($SiCl_x$) and so on. A material of the first and second polymer layers 150, 152 is, for example, hydrocarbons. A pressure of the etching apparatus is set from 50 mTorr to 150 mTorr when the first and second polymer layers 150, 152 are deposited, for example. In this embodiment, the thickness t1 of the first polymer layer 150 disposed on the top corners 112 of the first conductive patterns 110 can be 1 nm to 5 nm, preferably about 3 nm to 5 nm, and the thickness t2 of the second polymer layer 152 disposed on the bottom portions 122 of the first openings 120 can be about 1 nm to 3 nm.

Figure 1C:
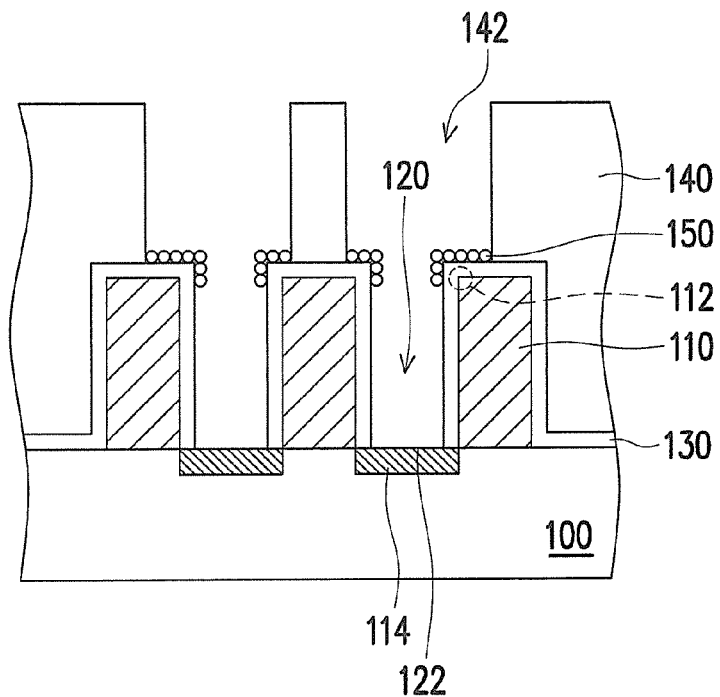

With reference to FIG. 1C, an etching process is performed to remove the second polymer layer 152 and the barrier layer 130 which are disposed on the bottom portions 122 of the first openings 120. Here, the etching process is, for example, a plasma etching process using a fluorine-containing plasma. In this embodiment, a portion of the first polymer layer 150 disposed on the top corners 112 of the first conductive patterns 110 is removed simultaneously by the etching process, for example. In detail, the thickness t1 of the first polymer layer 150 on the top corners 112 of the conductive patterns 110 is larger than the thickness t2 of the second polymer layer 152 on the bottom portions 122 of the first openings 120, and therefore the first polymer layer 150 is partially removed or totally removed by the etching process. As such, during the etching process, the barrier layer 130 is at least protected by the first polymer layer 150 and maintained intact rather than being damaged. In other words, when the second polymer layer 152 and the barrier layer 130 disposed on the bottom portions 122 of the openings 120 are removed to expose the second conductive patterns 114, the first polymer layer 150 which has a thickness t1 larger than that of the second polymer layer 152 can be used as a sacrificial layer to protect the underneath barrier layer 130 from being damaged. Therefore, the first conductive patterns 110 is covered by the barrier layer 130 rather than exposed. In this embodiment, a thickness of the barrier layer 130 disposed on the top corners 112 of the first conductive patterns 110 is about 5 nm to 15 nm, for example.

Figure 1D:
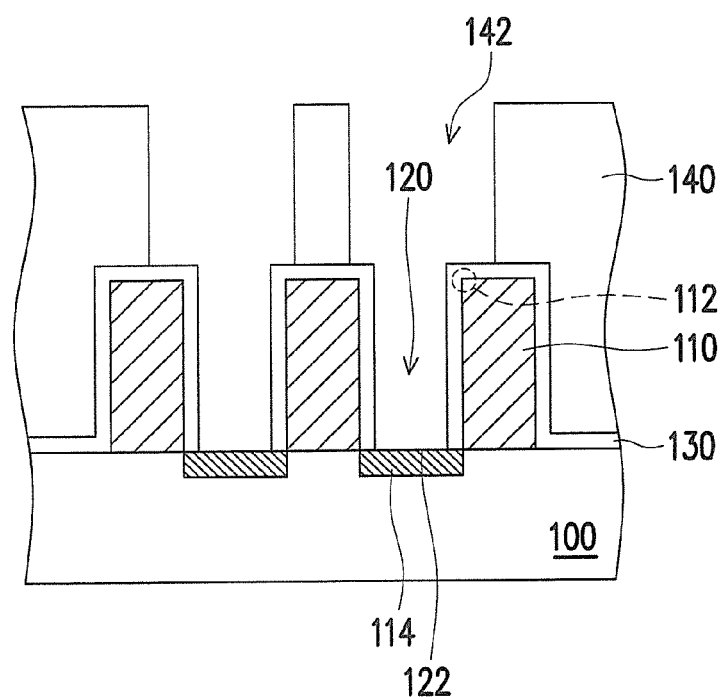

With reference to FIG. 1D, in this embodiment, after performing the etching process, the remained first polymer layer 150 disposed on the top corners 112 of the first conductive patterns 110 is further removed. The remained first polymer layer 150 is removed by performing an ashing process, for example.

Figure 1E:
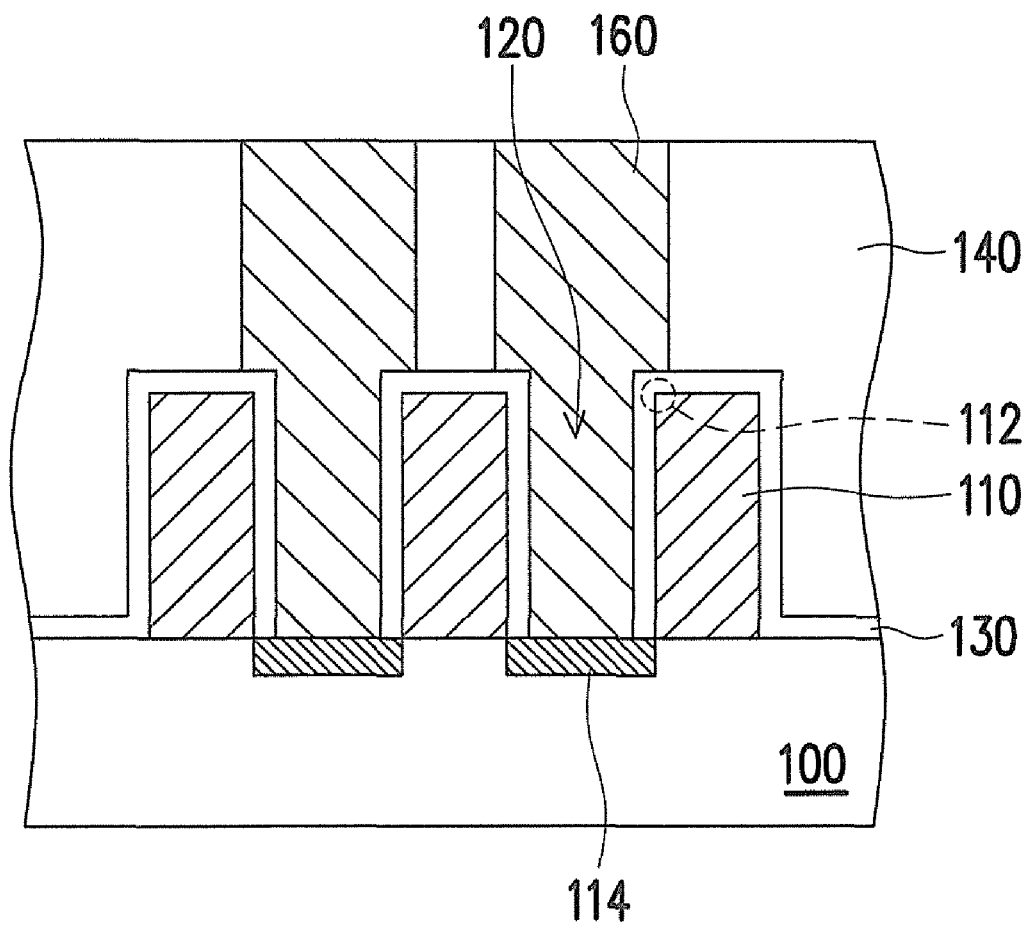

With reference to FIG. 1E, afterwards, the semiconductor device is transferred to a depositing apparatus, and a contact plug 160 is formed in each first opening 120, wherein the contact plug 160 is electrically insulated from the first conductive pattern 110 by the barrier layer 130, and the contact plug 160 is electrically connected to a corresponding second conductive pattern 114. In this embodiment, a material of the contact plugs 160 is, for example, tungsten, and a method of forming the contact plugs 160 is, for example, chemical vapor deposition.

In this embodiment, the step of forming the first and second polymer layers 150, 152 on the barrier layer 130 is performed in the etching apparatus, and the thickness t1 of the first polymer layer 150 deposited on the top corners 112 of the conductive patterns 110 is larger than the thickness t2 of the second polymer layer 152 deposited on the bottom portions 122 of the first openings 120. As such, when the barrier layer 130 disposed on the bottom portion 122 of the opening 120 is removed to expose the second conductive patterns 114, the barrier layer 130 disposed on the top corners 112 of the first conductive patterns 110 can be protected by the first polymer layer 150 formed thereon. Accordingly, the barrier layer 130 disposed on the top corners 112 of the first conductive patterns 110 is maintained intact and has a proper thickness. In other words, the polymer layer 150 protects the barrier layer 130 disposed on the top corners 112 of the conductive patterns 110 from rounding or thinning, thereby preventing the conductive patterns 110 being exposed. As such, the barrier layer 130 can provide superior insulating effect to the first conductive patterns 110 and the contact plugs 160. Therefore, the first conductive patterns 110 and the second conductive patterns 114 are electrically insulated from each other, and short between the first conductive patterns 110 and the second conductive patterns 114 due to the exposure of the first conductive patterns 110 is prevented. Moreover, the characteristics of the semiconductor device are improved. It is noted that the embodiment utilizes the poor step coverage caused by performing the in-situ deposition process in the etching apparatus to simultaneously form the polymer layers with different thickness. In other words, the semiconductor process of the embodiment has advantages of simplified steps, no requirement of additional equipments, and compatibility with exiting process, and therefore the process window is increased (i.e. cap-nitride increased) and the process cost is not significantly increased.

It is noted that the opening of the embodiment is formed to expose the second conductive pattern such as a bit line, and the invention is not limited thereto. In other words, the invention can be applied to any other semiconductor process which is used to remove a portion of the barrier layer in the opening and prevent another portion of the barrier layer being damaged, and therefore the characteristics of the semiconductor device can be improved.

In light of the foregoing, in the semiconductor process of the invention, the polymer layers are formed in the etching apparatus, thereby a thickness of the polymer layer disposed on the top corners of the conductive patterns larger than a thickness of the polymer layer disposed on bottom portions of the first openings. Thus, when the barrier layer on the bottom portions of the openings is removed, the barrier layer on the top corners of the conductive patterns is protected by the polymer layer formed thereon. As such, the barrier layer on the top corners of the conductive patterns is prevented from rounding or thinning, thereby providing superior insulating effect to the conductive patterns. Therefore, the characteristics of the semiconductor device are improved. Particularly, the invention utilizes the poor step coverage caused by performing the in-situ deposition process in the etching apparatus to simultaneously form the polymer layers with different thickness. In other words, the semiconductor process of the invention has advantages of simplified steps, no requirement of additional equipments, and compatibility with exiting process, and therefore the process window is increased and the process cost is not significantly increased.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor process, comprising:
providing a substrate in an etching apparatus, wherein a plurality of first conductive patterns, a barrier layer and a patterned insulating layer are formed on the substrate, a plurality of first openings is formed between the first conductive patterns, the barrier layer covers surfaces of the first conductive patterns and the first openings, the patterned insulating layer is formed on the first conductive patterns and has a plurality of second openings, the second openings expose the barrier layer disposed on top corners of the first conductive patterns, and each second opening is connected to a corresponding first opening;
depositing a first polymer layer and a second polymer layer on the barrier layer, wherein the first polymer layer is disposed on the top corners of the first conductive patterns, the second polymer layer is disposed on bottom portions of the first openings, and a thickness of the first polymer layer is larger than a thickness of the second polymer layer; and
performing an etching process to remove the second polymer layer and the barrier layer disposed on the bottom portions of the first openings.

2. The semiconductor process as claimed in claim 1, wherein the first polymer layer disposed on the top corners of the first conductive patterns is removed simultaneously by the etching process.

3. The semiconductor process as claimed in claim 1, after performing the etching process, further comprising removing the remained first polymer layer disposed on the top corners of the first conductive patterns.

4. The semiconductor process as claimed in claim 1, wherein the barrier layer disposed on the top corners of the first conductive patterns is not substantially etched by the etching process.

5. The semiconductor process as claimed in claim 4, wherein the thickness of the first polymer layer disposed on the top corners of the first conductive patterns is about 1 nm to 5 nm.

6. The semiconductor process as claimed in claim 4, wherein a thickness of the barrier layer disposed on the top corners of the first conductive patterns is about 5 nm to 15 nm.

7. The semiconductor process as claimed in claim 1, wherein a plurality of second conductive patterns is formed in the substrate, and each first opening exposes a corresponding second conductive pattern after performing the etching process.

8. The semiconductor process as claimed in claim 7, after performing the etching process, further comprising forming a contact plug in each first opening, wherein the contact plug is electrically insulated from the first conductive pattern by the barrier layer, and the contact plug is electrically connected to a corresponding second conductive pattern.

9. The semiconductor process as claimed in claim 1, wherein a pressure of the etching apparatus is set from 50 mTorr to 150 mTorr when the first polymer layer and the second polymer layer are deposited.

10. The semiconductor process as claimed in claim 1, wherein a method of depositing the first polymer layer and the second polymer layer comprises using an etching gas including silicon fluoride and silicon chloride.

11. The semiconductor process as claimed in claim 1, wherein a material of the first polymer layer and the second polymer layer comprises hydrocarbons.

12. The semiconductor process as claimed in claim 1, wherein a material of the barrier layer comprises low pressure TEOS.

13. The semiconductor process as claimed in claim 1, wherein the etching process comprises a plasma etching process.

14. The semiconductor process as claimed in claim 1, wherein the etching process is performed by using a fluorine-containing plasma.

* * * * *